(12) United States Patent
Livesay et al.

(10) Patent No.: US 6,900,001 B2
(45) Date of Patent: May 31, 2005

(54) METHOD FOR MODIFYING RESIST IMAGES BY ELECTRON BEAM EXPOSURE

(75) Inventors: William R. Livesay, San Diego, CA (US); Matthew F. Ross, San Diego, CA (US)

(73) Assignee: Applied Materials, Inc., Santa Clara, CA (US)

(*) Notice: Subject to any disclaimer, the term of this patent is extended or adjusted under 35 U.S.C. 154(b) by 182 days.

(21) Appl. No.: 10/357,312

(22) Filed: Jan. 31, 2003

(65) Prior Publication Data

US 2004/0152024 A1 Aug. 5, 2004

(51) Int. Cl.[7] .................................................. G03F 7/20
(52) U.S. Cl. ........................ 430/325; 430/322; 430/328; 430/330; 430/296
(58) Field of Search .................................. 430/311, 296, 430/322, 325, 328, 330

(56) References Cited

U.S. PATENT DOCUMENTS 5,003,178 A  3/1991  Livesay ................... 250/492.3
5,648,198 A  * 7/1997  Shibata ..................... 430/296
6,319,655 B1  11/2001  Wong et al. ............... 430/311
6,589,709 B1  * 7/2003  Okoroanyanwu et al. ... 430/296

* cited by examiner

Primary Examiner—Kathleen Duda
(74) Attorney, Agent, or Firm—Roberts & Roberts

(57) ABSTRACT

It has now been surprisingly found that by exposing a photoresist to flood electron beam exposure in combination with optical exposure, that the pullback on the upper region of lithographic images in resist can be virtually eliminated during electron beam processing. This unexpected result is due to the fact that the electron beam exposure and optional bake are carried out prior to development of the resist. This means that the resist shrinkage that is seen as a result of these steps is constrained laterally by the resist film itself. Thus, the resist is free to shrink vertically, and the resulting shrinkage provides a reduction in the line slimming and an improvement in the etch rate of the resist. This leads to the formation of a better resist image.

16 Claims, 12 Drawing Sheets

Process Outline

1. Resist is applied to the substrate (1) and post-apply baked (PAB) (2).

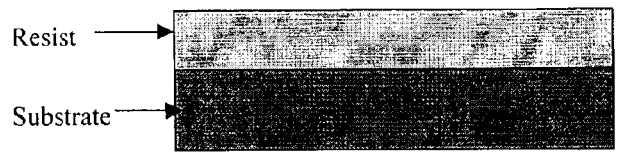

2. The resist is exposed at the appropriate wave-length (3) and post-exposure baked (PEB) (4). (356nm, 248nm, or 193nm)

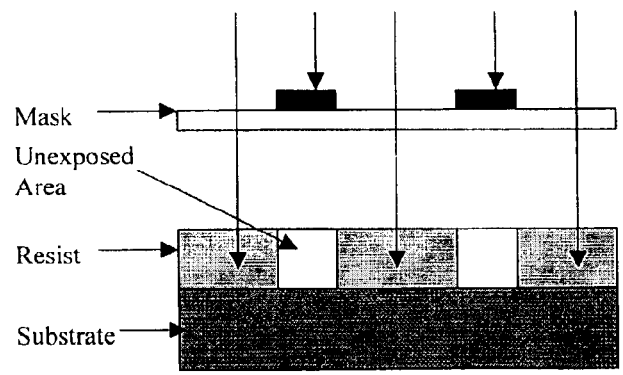

3. The entire area of the substrate is exposed with the flood electron beam (5). (The appropriate energy, current and dose are used for the e-beam exposure.)

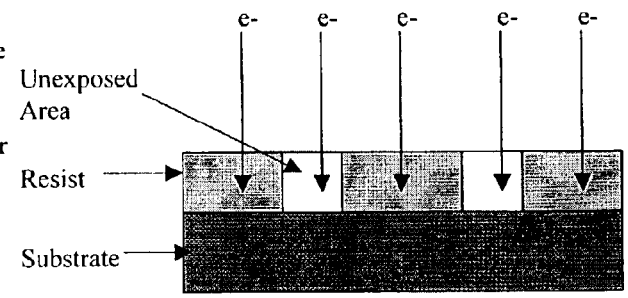

4. (Optional) The substrate is baked after the electron beam exposure. (6)

5. The resist is developed with the unexposed areas remaining. (7)

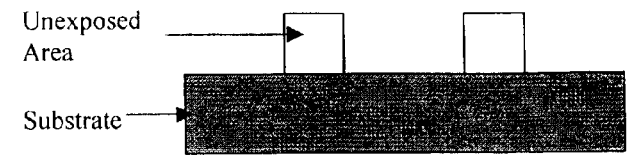

6. The resist can be stabilized with an additional flood electron beam exposure. (8)

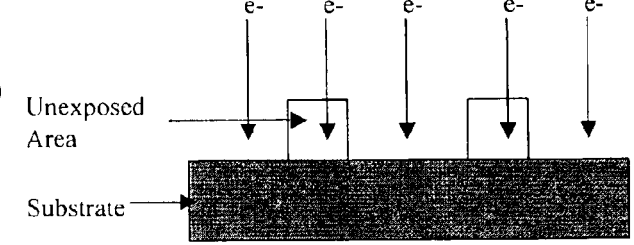

FIG. 11

Line End Rounding and Shortening
Mask Pattern
(Top View)
Standard Processing: Optical Exposure – Post Exposure Bake and Development
Resist Pattern
(Top View)
Line End
Rounding and
Shortening
Resist Pattern
(Side View)
Modified Processing: Optical Exposure – Electron Beam Exposure –
Post Exposure Bake and Development
FIG. 12

METHOD FOR MODIFYING RESIST IMAGES BY ELECTRON BEAM EXPOSURE

BACKGROUND OF THE INVENTION

1. Field of Invention

The present invention relates to a method for modifying photoresist images, which are suitable for use in the production of electronic devices such as integrated circuits. More particularly, the invention provides a method for modifying photoresist images by applying a flood electron beam exposure to the resist in combination with optical exposure or patterning.

2. Description of the Related Art

The production of photoresists is well known in the art as exemplified by U.S. Pat. Nos. 3,666,473; 4,115,128 and 4,173,470. These contain aqueous alkali soluble polyvinyl phenol or phenol formaldehyde novolak resins together with light sensitive materials, usually a substituted naphthoquinone diazide compound. The resins and sensitizers are dissolved in an organic solvent and are applied as a thin film coating to a substrate suitable for the particular application desired. The resin component of photoresist formulations is soluble in an aqueous alkaline solution, but the photosensitizer is not. Upon imagewise exposure of the coated substrate to actinic radiation, the exposed areas of the coating are rendered more soluble than the unexposed areas. This difference in solubility rates causes the exposed areas of the photoresist coating to be dissolved when the substrate is immersed in an alkaline developing solution, while the unexposed areas are substantially unaffected, thus producing a positive image on the substrate. The uncovered substrate is thereafter subjected to an etching process. Frequently, this involves a plasma etching against which the resist coating must be sufficiently stable. The photoresist coating protects the covered areas of the substrate from the etchant and thus the etchant is only able to etch the uncovered areas of the substrate. Thus, a pattern can be created on the substrate which corresponds to the pattern of the mask or template that was used to create selective exposure patterns on the coated substrate prior to development.

Photoresists are either positive working or negative working. In a negative working resist composition, the imagewise light struck areas harden and form the image areas of the resist after removal of the unexposed areas with a developer. In a positive working resist the exposed areas are the non-image areas. The light struck parts are rendered soluble in aqueous alkali developers. The ability to reproduce very small dimensions, is extremely important in the production of large scale integrated circuits on silicon chips and similar components. As the integration degree of semiconductor devices becomes higher, finer photoresist film patterns are required. One way to increase circuit density on a semiconductor chip is by increasing the resolution capabilities of the resist. Positive photoresists have been found to be capable of much higher resolution and have almost universally replaced negative resists for this purpose.

The optimally obtainable microlithographic resolution is essentially determined by the radiation wavelengths used for the selective irradiation. However the resolution capacity that can be obtained with conventional deep UV microlithography has its limits. In order to be able to sufficiently resolve optically small structural elements, wavelengths shorter than deep UV radiation must be utilized. The use of UV radiation has been employed for many applications, particularly radiation with a wavelength of 157 nm, 193 nm and 248 nm. In particular, the radiation of lasers is useful for this purpose. The deep UV photoresist materials that are used today, however, are not suitable for 157 nm, 193 nm and 248 nm exposure. Materials based on phenolic resins as a binding agent, particularly novolak resins or polyhydroxystyrene derivatives have too high an absorption at wavelengths and one cannot image through films of the necessary thickness. This high absorption results in side walls of the developed resist structures which do not form the desired vertical profiles. Rather they have an oblique angle with the substrate which causes poor optical resolution characteristics at these short wavelengths. Polyhydroxystyrene based resists can be used in top surface imaging applications in which a very thin (~500 Å) layer of resist is required to be transparent at ArF laser exposure wavelengths.

Photoresists based on chemical amplification have been developed, which have been found to have superior resolution. Currently available are 157 nm, 193 nm and 248 nm photoresists, which are based on chemically amplified deprotection. With this mechanism, a molecule of photogenerated acid catalyzes the breaking of bonds in a protecting group of a polymer. During the deprotecting process, another molecule of the same acid is created as a byproduct, and continues the acid-catalytic deprotection cycle. The chemistry of a 157 nm, 193 nm and 248 nm photoresist is based on polymers such as, but not limited to, acrylates, cyclic olefins with alicyclic groups, and hybrids of the aforementioned polymers which lack aromatic rings. Chemically amplified resist films have played a significant role in the fine pattern process using deep UV. However, in many cases they lack either sufficient etch resistance, thermal stability, post exposure delay stability, and/or processing latitude. While such photoresists are sufficiently transparent for deep uv radiation, they do not have the etching stability customary for resists based on phenolic resins for plasma etching. A typical chemical amplification photoresist film comprises a polymer, a photoacid generator, and other optional additives. The polymer is required to be soluble in the chosen developer solution, and have high thermal stability and low absorbance to the exposure wavelength in addition to having excellent etch resistance. It would be desirable to overcome the above mentioned problems and to provide a photoresist film superior in etch resistance, as well as transmittance to deep UV.

There have been several attempts to solve this problem. One attempt to improve the etching stability of photoresists based on meth(acrylate) polymers introduced cycloaliphatic groups into the meth(acrylate) polymers. This leads to an improvement in etching stability, but not to the desired extent. Another proposal aims at producing sufficient etching stability only after irradiation in the resist coating. It has also been proposed to treat the substrate with the finished, developed, image-structured photoresist coating with specific alkyl compounds of magnesium or aluminum, in order to introduce the given metals in the resist material as etching barriers (See U.S. Pat. No. 4,690,838). The use of metal-containing reagents, however, is generally not desired in microlithography process, due to the danger associated with contamination of the substrate with metal ions.

U.S. Pat. No. 6,319,655, which is incorporated herein by reference, describes a process for improving the etch resistance of chemically amplified resists, in particular 193 nm sensitive photoresists, using a large area electron beam exposure. Electron beam exposure of chemically amplified photoresists, in particular 193 nm sensitive photoresists has been shown to improve the etch resistance and thermal stability of these photoresists. Many different formulations of chemically amplified photoresist utilized for 193 nm exposure have been developed. Some examples of materials used for 193 nm lithography are given in patent No. U.S. Pat. No. 6,319,655. For the next generation of lithography, new resist materials sensitive to 157 nm irradiation will be utilized for this application. Some of these materials, incorporated herein by reference, are listed in "Organic Imaging Materials, A View of the Future" by Michael Stewart et al., Journal of Physical Organic Chemistry, J. Phys. Org. Chem. 2000; 13: 767–774, "157 nm Resist Materials: Progress Report" by Colin Brodsky et al., J. Vac. Sci. Technol. B 18(6), Nov/Dec 2000, 3396–3401, and in "Synthesis of Siloxanes and Silsesquioxanes for 157 m Microlithography" by Hoang V. Tran, et al, Polymeric Materials: Science & Engineering 2001, 84. Due to the volatility of the additives in these resist materials, electron beam exposure causes the expulsion of these additives, which causes shrinking of the resist. For 248 nm, 193 nm, and 157 nm resist technologies, chemical amplification is used to achieve high photo speed at the low exposure energies of the selected wavelength sources. For future lithography generations using extreme ultraviolet and x-ray wavelengths of 1–100 nanometers, similar chemically amplified resists are anticipated. The basic resist design concept is to start with a resin that has good transparency at the selected wavelength. The resin must be highly soluble in aqueous base developer chemistry. To make the resin insoluble in the developer, dissolution inhibitors, sometimes called blocking or protecting groups, are attached to the resin. These are usually very large, or bulky, molecules that are attached to the resin via bonds that can be easily cleaved. In most advanced resist systems there are usually several types of molecules attached to the resin in addition to the dissolution inhibitor. These include molecules that enhance the etch resistance of the material as well as molecules that help with lithographic performance. All of these molecules are attached to the resin via a link that is easily cleaved. The chemical amplification is achieved by adding a small amount of a photo-acid generator (PAG). This is a compound that generates a proton ($H^+$) when exposed at the appropriate wavelength. These are usually onium salts, such as sulfonium salts, but it can be any of a number of suitable compounds. When the PAG is exposed and the proton is generated, the proton cleaves the nearest available bond between the resin and dissolution inhibitor. This cleaving reaction generates another proton, which cleaves the next nearest bond, and so on. This reaction can occur during the optical exposure, for low activation energy resists, or during the subsequent post-exposure bake (PEB), for high activation energy resists. The result of the de-protection reaction is the formation of an acid, which is then soluble in an aqueous base developer. As a result of the cleaving of the link between the resin and the blocking group, the blocking molecule usually leaves the resist as a volatile. In this way the resist can be fully exposed even though the incident optical exposure dose is very low, on the order of 10 to 20 $mJ/cm^2$.

After the optical exposure and completion of the de-protection reactions, the resist in the exposed areas can shrink from ten to twenty percent. This is due to the loss of the bulky protecting groups as volatiles. This reaction does not happen in the unexposed areas, which provides the contrast to form the images. Since the unexposed resist still contains the resin with the attached blocking groups, it is susceptible to shrinkage if these molecules are removed.

Due to the constraints of the resist design, and since the blocking groups are easily cleavable, the blocking groups can be removed by other means. One reaction path is thermal activation, where the resist is heated to a temperature that thermally breaks the bonds. This happens at different temperatures for the different protection groups but can be a low as 40° C. to as high as 200° C. Thermal activation results in the loss of the blocking groups as volatiles and a shrinkage of the resist. The blocking groups can also be removed by other radiation sources including plasma discharges, or accelerated particles.

During electron beam exposure, a reaction that is similar to the optical exposure can occur which cleaves the link between the protecting groups and the resin resulting in shrinkage of the resist. This reaction, and the associated resist shrinkage, is accelerated as the resist is heated by the energy of the incident electron beam. Since the full thickness of the resist is targeted for stabilization, substantial mass loss, and shrinkage, can result from the electron beam exposure. Because the interface between the resist and substrate is constrained, the remainder of the resist shrinks in three dimensions. This leads to a phenomenon known as "pullback" where the top of the resist shrinks relative to the bottom. This effect is most pronounced on lithographic features such as contacts, line ends, and feature corners. The pullback phenomenon has undesired effects on the features, which make them unacceptable for device fabrication. This shrinkage occurs throughout the exposed regions of the photoresist and can cause deformation in the form of pull-back on the upper portions of lithography features.

Many attempts have been made to correct or eliminate this resist deformation or pullback by using different process steps with the electron beam exposure. Lower current density exposures have been attempted to minimize the shrinkage as well as surface curing of the photoresist, that is, lowering the energy of electrons such that only the upper portion of the resist receives the electron beam exposure. Higher doses of electrons have been utilized at the lower portion, relatively to the upper portion, of the resist in an effort to minimize this pullback. In addition, different formulations of photoresist have been attempted to minimize the shrinkage and expulsion of resist components to minimize the pullback. Lower flux electrons with longer exposure times have also been utilized to minimize resist heating effects thereby reducing the temperature of the resist during electron beam exposure to no more than 50° C. All of these attempts have failed at reducing the pullback effect caused by the electron beam hardening process.

Furthermore, additional issues such as proximity effects, acid diffusion, and aerial image quality, effect the resulting features printed in resist films. These issues limit the ability to print the desired patterns for manufacturing. Issues such as line slimming and etch resistance effect the subsequent processing of the patterned resist. Line slimming, which is more pronounced with chemically amplified resists, and especially with ArF or 193 nm resists, is a phenomenon where the resist shrinks when it is being measured by a CD-SEM. Thus the features change in shape while they are being measured. This impacts the ability to determine the exact result of the lithography process as well as the ability to monitor the process for variations. The lack of etch resistance of the materials limits the ability of the resist to provide an adequate mask for pattern transfer. This effects the resulting etched pattern, and ultimately the performance characteristics of the devices being manufactured. In co-pending U.S. patent application Ser. No. 10/090,465, filed on Mar. 4, 2002, which is incorporated herein by reference, a technique is described for reducing the pullback caused by lateral resist shrinkage during e-beam stabilization by cooling the wafer during e-beam irradiation.

It has now been surprisingly found that by exposing the photoresist to flood electron beam exposure after optical or other patterned exposure but prior to the develop step, that the pullback or lateral resist shrinkage on the upper region of lithographic images in resist can be significantly reduced during electron beam processing. This unexpected result is due to the fact that the flood electron beam exposure and optical or other patterned exposure are applied in combination, and are carried out prior to development of the resist. This means that the resist shrinkage that is seen as a result of these steps is constrained laterally by the resist film itself. Thus, the resist is free to shrink vertically, and the resulting shrinkage provides a reduction in the line slimming and an improvement in the etch rate of the resist without significant pullback or rounding of the resist images This leads to the formation of a better resist image.

SUMMARY OF THE INVENTION

The invention provides a method for forming a shrinkage-controlled photoresist images, comprising the steps of sequentially:
a) applying and drying a photoresist onto a surface of a substrate to thereby form a photoresist film on the substrate; thereafter
b) imagewise exposing the photoresist film to actinic radiation to thereby form image and nonimage areas of the photoresist film; thereafter
c) optionally heating the entire photoresist film to degrade the non-image areas of the photoresist film;
d) overall flood exposing the entire photoresist film to electron beam radiation to thereby cause a chemical change in the image and nonimage areas of the photoresist film; thereafter
e) optionally heating the photoresist film again to thereby cause a further chemical change in the photoresist film; thereafter
f) developing the photoresist film with a developer, such that the nonimage areas of the photoresist film are removed, and the image areas of the photoresist film remain on the substrate; and
g) optionally thereafter again overall flood exposing the image areas of the photoresist film and the substrate to electron beam radiation to thereby further cause a chemical change in the image areas of the photoresist film.

The invention also provides a shrinkage-controlled photoresist image, formed by a process comprising the steps of sequentially:
a) applying and drying a photoresist onto a surface of a substrate to thereby form a photoresist film on the substrate; thereafter
b) imagewise exposing the photoresist film to actinic radiation to thereby form image and nonimage areas of the photoresist film; thereafter
c) optionally heating the entire photoresist film to degrade the non-image areas of the photoresist film;
d) overall flood exposing the entire photoresist film to electron beam radiation to thereby cause a chemical change in the image and nonimage areas of the photoresist film; thereafter
e) optionally heating the photoresist film again to thereby cause a further chemical change in the photoresist film; thereafter
f) developing the photoresist film with a developer, such that the nonimage areas of the photoresist film are removed, and the image areas of the photoresist film remain on the substrate; and
g) optionally thereafter again overall flood exposing the image areas of the photoresist film and the substrate to electron beam radiation to thereby further cause a chemical change in the image areas of the photoresist film.

BRIEF DESCRIPTION OF THE DRAWINGS

FIG. 11 shows a flow chart of the process steps according to the present invention.

FIG. 12 shows a representation of various resist patterns according to the invention which exhibit decreased line end rounding and shortening as compared to standard processing methods.

DETAILED DESCRIPTION OF THE PREFERRED EMBODIMENTS

Figure 1A:
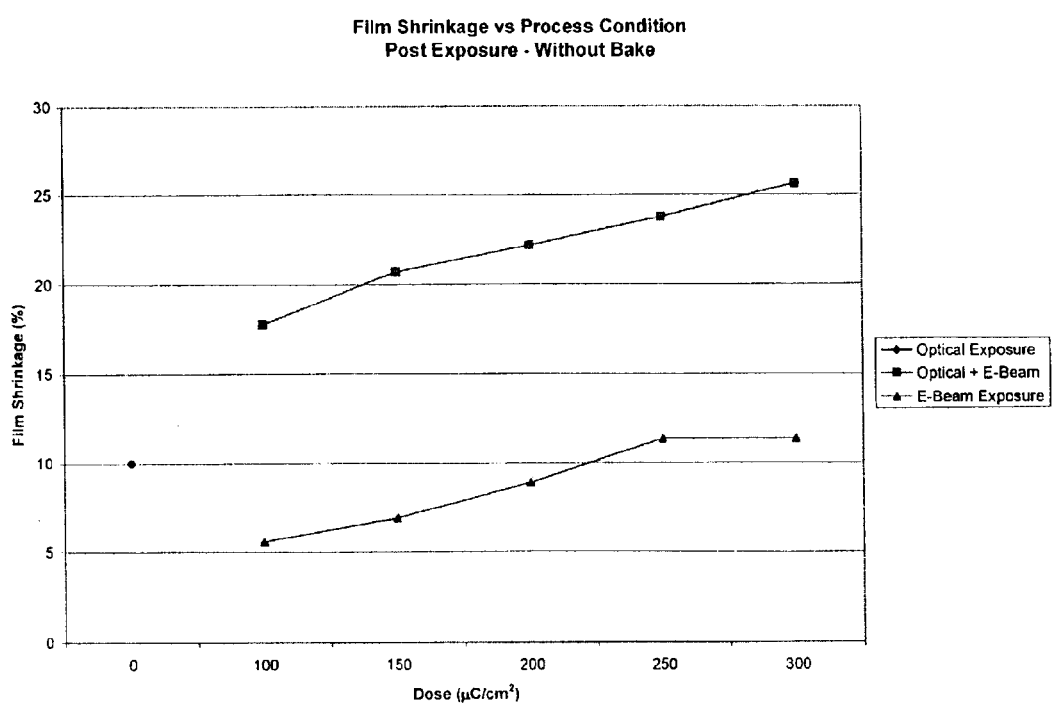
FIGS. 1A and 1B show graphs of resist shrinkage as a function of dose for optically exposed, optically plus e-beam exposed, and e-beam exposed areas without and with baking.

The following describes a method for forming shrinkage controlled resist images by imagewise exposing the photoresist film to actinic radiation and overall flood exposing the photoresist film to electron beam radiation, prior to development.

According to the invention, a coating of a suitable photoresist is first applied onto a substrate. The photoresist may be positive working or negative working. Suitable photoresists, particularly those which are photosensitive at 157 nm, 193 nm and 248 nm or x-ray wavelengths or sensitive to electron beam radiation are well known in the art and widely commercially available. Such include K98 and D3 available from the Shipley Company; 620-10 from Olin Microelectronics Materials, AM01, AM02 and AM03 from Japan Synthetic Rubber Company, TOK-TArF-5A-1 and TOK-TArF-6A-1 from Tokyo Ohka Kogyo Co. Other suitable photoresists include solutions of polymethylmethacrylate (PMMA), such as a liquid photoresist available as 496 k PMMA, from OLIN HUNT/OCG, West Paterson, N.J. 07424, comprising polymethylmethacrylate with molecular weight of 496,000 dissolved in chlorobenzene (9 wt %); P(MMA-MAA) (poly methyl methacrylate-methacrylic acid); PMMA/P(MMA-MAA) polymethylmethacrylate/ (poly methyl methacrylate-methacrylic acid). Other photoresists which are photosensitive at 157 nm, 193 nm and 248 nm and x-ray wavelengths are commercially available from a number of sources, including Shipley Company, Kodak, Hoechst Celanese Corporation, Clariant, Hunt, Arch Chemical, Aquamer, JSR Microelectronics, and Brewer. Numerous publications discuss the improved performance of these photoresists using a large area electron beam exposure of these materials, including "Modification of 193 nm (ArF) Photoresists by Electron Beam Stabilization" by Patrick Martens et al., and "Investigation of Electron Beam Stabilization of 193 nm Photoresists" by Myoung-Soo Kim et al, SPIE Microlithography 2001 Conference Proceedings; "Organic Imaging Materials, A View of the Future" by Michael Stewart et al., Journal of Physical Organic Chemistry, J. Phys. Org. Chem. 2000; 13: 767–774, "157 nm Resist Materials: Progress Report" by Colin Brodsky et al., J. Vac. Sci. Technol. B 18(6), Nov/Dec 2000, 3396–3401, and in "Synthesis of Siloxanes and Silsesquioxanes for 157 m Microlithography" by Hoang V. Tran, et al, Polymeric Materials: Science & Engineering 2001, 84. A useful 248 nm photoresist is DX-1179 available from Clariant Corporation.

In a preferred embodiment, the photoresist comprises a photosensitive composition. The photosensitive compositions useful for the invention are themselves well known in the art and are typically composed of a mixture of a water insoluble, acid decomposable polymer which is substantially transparent to ultraviolet or x-ray radiation at a wavelength of about 157 nm, 193 nm, 248 nm or those of x-rays; and a photosensitive compound capable of generating an acid upon exposure to sufficient activating energy at a wavelength of about 157 nm, 193 nm, 248 nm or those wavelengths of x-rays, or electron beams. In one preferred embodiment, the photoresist comprises a combination of a naphthoquinone diazide and an aqueous alkaline soluble or swellable polymer.

Acid decomposable polymers suitable for a chemical amplification photoresists are well known in the art and nonexclusively include cyclic olefins, and acrylics and methacrylates such as polyalkylacrylates and polyalkylmethacrylates, norbornene containing polymers, and alicyclic polymers. The most widely employed route involves free radical copolymerization of maleic anhydride with a cyclic olefin monomer. The maleic anhydride serves as an oxygen-rich polar unit whose hydrophilic nature offsets the hydrophobic nature of the cyclic olefin monomer. Others polymers include polymethylacrylate and polymethylmethacrylate (PMMA) as well as copolymers thereof and polymers which have a backbone of polymethylmethacrylate having pendant groups which do not substantially reduce the transparency of the polymer at the wavelengths of interest. PMMA has a particularly high transmittance to the light of 193 nm wavelength and it is known for its clarity, surface hardness, UV transparency and chemical resistance. PMMA is readily commercially available from Aldrich Chemical Company of Milwaukee, Wis. Preferably the polymer has a molecular weight in the range of from about 1,000 to about 800,000. Alicyclic polymers include acrylate/ alicyclic polymers such as hybrid polymers produced by the free radical copolymerization of norbornene, maleic anhydride and either acrylic acid or t-butyl acrylate. A terpolymer of acrylonitrile, tertiary-butyl methacrylate and methacrylic acid has also been shown to have high transparency at 193 nm and excellent dry etch resistance. Siloxanes, silsesquioxane and poly{5-(2-t-butoxycarbonyloxy-2-trifluoromethyl-3,3,3-trifluoropropyl)norbornene] and hexafluoro-2-propanol polymers are useful for 157 nm sensitive compositions. Poly(4-hydroxystyrene) and poly(4-tert-butyloxy-carbonyloxystyrene) polymers are useful for 248 nm photoresist compositions.

The photosensitive composition may be formed by admixing the ingredients in a suitable solvent composition. In the preferred embodiment the polymer is preferably present in the overall composition in an amount of from about 50% to about 99% based on the weight of the solid, i.e. non-solvent parts of the composition. A more preferred range of copolymer would be from about 80% to about 99% and most preferably from about 82% to about 95% by weight of the solid composition parts. The photosensitive compound is preferably present in an amount ranging from about 1% to about 20% based on the weight of the solid, i.e., non-solvent parts of the composition. A more preferred range of the photosensitive compound would be from about 5% to about 20% by weight of the solid composition parts. In preparing the composition, the polymer and photosensitive compound are mixed with a sufficient amount of a solvent composition to form a uniform solution. Such solvents include propylene glycol alkyl ether acetate, butyl acetate, ethylene glycol monoethyl ether acetate, diglyme, cyclopentanone and propylene glycol methyl ether acetate, among others. The composition may additionally contain additives such as colorants, dyes, anti-striation agents, leveling agents, crosslinkers, plasticizers, adhesion promoters, speed enhancers, solvents, acid generators, dissolution inhibitors and non-ionic surfactants.

In one preferred embodiment of the invention, the photoresist comprises a photosensitive composition which comprises:

(i) at least one water insoluble, acid decomposable polymer which is substantially transparent to ultraviolet or x-ray radiation, wherein said polymer is present in the photosensitive composition in an amount sufficient to form a uniform film of the composition components when it is coated on a substrate and dried; and (ii) at least one photosensitive compound capable of generating an acid upon exposure to sufficient activating ultraviolet, electron beam or x-ray radiation energy, said photosensitive compound being present in an amount sufficient to substantially uniformly photosensitive the photosensitive composition.

Useful photosensitive compounds, capable of generating an acid upon exposure to sufficient activating energy at a wavelength of about 157 nm, 193 nm, 248 nm or those of x-rays, or electron beams, include onium salts such as sulfonium, diazonium and iodonium salts. Sulfonium salts are described in U.S. Pat. No. 4,537,854; diazonium salts are described in Light Sensitive Systems, Kosar, J.; John Wiley & Sons, New York, 1965. Iodonium salts are described in U.S. Pat. No. 4,603,101.

Examples of dye additives that may be used together with the photoresist compositions of the present invention include Methyl Violet 2B (C.I. No. 42535), Crystal Violet (C.I. 42555), Malachite Green (C.I. No. 42000), Victoria Blue B (C.I. No. 44045) and Neutral Red (C.I. No. 50040) in an amount of from about 1.0 to about 10.0 percent, based on the combined weight of the solid parts of the composition. The dye additives help provide increased resolution by inhibiting back scattering of light off the substrate. Anti-striation agents may be used up to five percent weight level, based on the combined weight of solids. Adhesion promoters which may be used include, for example, beta-(3,4-epoxy-cyclohexyl)ethyltrimethoxysilane; p-methyl-disilane-methyl methacrylate; vinyltrichlorosilane; and gamma-amino-propyl triethoxysilane up to a 4.0 percent based on the combined weight of solids. Speed enhancers that may be used include, for example, picric acid, nicotinic acid or nitrocinnamic acid at up to 20 percent, based on the combined weight of copolymer and solids. These enhancers tend to increase the solubility of the photoresist coating in both the exposed and unexposed areas, and thus they are used in applications when speed of development is the overriding consideration even though some degree of contrast may be sacrificed; i.e., while the exposed areas of the photoresist coating will be dissolved more quickly by the developer, the speed enhancers will also cause a larger loss of photoresist coating from the unexposed areas. Non-ionic surfactants that may be used include, for example, nonylphenoxy poly(ethyleneoxy)ethanol; octylphenoxy(ethyleneoxy)ethanol; and dinonyl phenoxy poly(ethyleneoxy)ethanol at up to 10 percent based on the combined weight of solids.

The photoresist can be applied to a substrate by any conventional method known in the photoresist art, including dipping, spraying, whirling, spin coating, and the like. Spin-coating is most preferred. Suitable systems for spin-coating are available from Tokyo Electron Limited (TEL), Silicon Valley Group (SVG), Dia-Nippon Screen (DNS), and several other manufacturers. The conditions for processing are according to the resist manufacturers recommendations. When spin coating, for example, the resist solution can be adjusted as to the percentage of solids content in order to provide coating of the desired thickness given the type of spinning equipment utilized and the amount of time allowed for the spinning process. In a preferred embodiment of the invention, the photoresist layer is formed by centrally applying a liquid photoresist composition to the upper surface on a rotating wheel at speeds ranging from about 500 to about 6000 rpm, preferably from about 1500 to about 4000 rpm, for about 5 to about 60 seconds, preferably from about 10 to about 30 seconds, in order to spread the composition evenly across the upper surface. The thickness of the photoresist layer may vary depending on the amount of liquid photoresist composition that is applied, but typically the thickness may range from about 500 Å to about 50,000 Å, and preferably from about 2000 Å to about 12000 Å. The amount of photoresist composition which is applied may vary from about 1 ml to about 10 ml, and preferably from about 2 ml to about 8 ml depending on the size of the substrate.

Suitable substrates nonexclusively include silicon, aluminum, lithium niobate, polymeric resins, silicon dioxide, doped silicon dioxide, gallium arsenide, Group III/V compounds, II/VI compounds, silicon nitride, tantalum, copper, polysilicon, ceramics and aluminum/copper mixtures. Semiconductor substrates are most preferred, particularly in the formation of microelectronic devices. Lines may optionally be on the substrate surface. The lines, when present, are typically formed by well known lithographic techniques and may be composed of a metal, an oxide, a nitride or an oxynitride. Suitable materials for the lines include silica, silicon nitride, titanium nitride, tantalum nitride, aluminum, aluminum alloys, copper, copper alloys, tantalum, tungsten and silicon oxynitride. These lines form the conductors or insulators of an integrated circuit. Such are typically closely separated from one another at distances preferably of from about 20 micrometers or less, more preferably from about 1 micrometer or less, and most preferably of from about 0.05 to about 1 micrometer.

The photoresist-coated substrate is then heat treated, such as by baking, to thereby form a dried photoresist film on the substrate. According to the invention, this baking step may be a "PAB" or post-apply bake. Suitable systems for baking are available from Tokyo Electron Limited (TEL), Silicon Valley Group (SVG), Dia-Nippon Screen (DNS), and several other manufacturers. The conditions for processing are according to the resist manufacturers recommendations. Preferred heating temperatures range from about 90° C. to about 160° C., more preferably from about 90° C. to about 150° C., and most preferably from about 110° C. to about 140° C. Such heating may be conducted for from about 5 seconds to about 30 minutes, preferably for from about 30 seconds to about 3 minutes, and more preferably for from about 30 seconds to about 2 minutes.

The photoresist film is then imagewise exposed to a source of actinic radiation, such as ultraviolet light radiation to thereby form image and nonimage areas of the photoresist film. Such is preferably done through an etch mask. The exposure renders the exposed areas of a positive working photoresist film more soluble in the developer after exposure than prior to exposure. When a chemical amplification resist is exposed to light, activated acid induces a catalytic chain reaction to a photoresist film organic polymer, generating a significant amount of protons. In the resist, protons bring a large change into the solubility of the resin. When the photoresist film is irradiated by a high energy beam, acid ($H^+$) is generated, reacting with the polymer. Acid is again generated and reacts with unreacted polymer. The polymer is then dissolved in a developing solution. In contrast, the polymer at the non-exposed areas of the resist maintains its structure which is insoluble to the developing solution. With such a mechanism, a good profile pattern can be made on a wafer substrate. The amount of actinic radiation used is an amount sufficient to render the exposed portions of the photoresist layer imagewise soluble in a suitable developer.

Such actinic exposure may be conducted using any suitable conventional method, such as using a stepper or scanner or the like. Suitable systems for optical exposure are available from ASML, Silicon Valley Group, Nikon, Cannon, and others. The wavelength of the light and the exposure dose will depend on the resist considered, per the manufacturers recommended processes. Examples are 365 nm, 248 nm, 193 nm, 157 nm or x-ray exposure wavelengths or by imagewise electron beam exposure. The specific conditions will depend on the resist type and exposure system.

Preferably, UV radiation is used in an amount sufficient to render the exposed portions of the photoresist film imagewise soluble in a suitable developer. Exposure doses preferably range from about 5 $mJ/cm^2$ to about 300 $mJ/cm^2$, more preferably from about 5 $mJ/cm^2$ to about 100 $mJ/cm^2$ and still more preferably from about 10 $mJ/cm^2$ to about 30 $mJ/cm^2$. In one example, exposure is done via an ArF laser, i.e. at a wavelength of from about 193 nm. When an ArF laser is used for exposure, exposure doses preferably ranges from about 1 $mJ/cm^2$ to about 10 $mJ/cm^2$, more preferably from about 2 $mJ/cm^2$ to about 8 $mJ/cm^2$.

The imagewise exposed photoresist film is then heat treated, such as by baking, prior to developing, for a sufficient time and temperature to increase the rate at which the acid decomposes the polymer in the imagewise exposed areas of the photoresist film. According to the invention, this baking step may be a "PEB" or post-exposure bake. This step drives the acid reaction for better image formation.

Such baking may be conducted at temperatures of from about 50° C. to about 150° C., preferably from about 120° C. to about 150° C. for from about 30 seconds to about 2 minutes.

An important feature of the invention is that the entire photoresist film is next overall flood exposed to electron beam radiation, prior to developing. The electron beam exposure will induce chemical changes in both the exposed and unexposed portions of the resist The electron beam irradiating is preferably conducted with a uniform, large-area, overall electron beam exposure source which exposes substantially all of the image areas of the photoresist film simultaneously. Electron beam radiation may take place in any chamber having a means for providing electron beam radiation to substrates placed therein. It is preferred that the electron beam exposing step is conducted with a wide, large beam of electron radiation from a large-area electron beam source. Preferably, an electron beam chamber is used which provides a large area electron source. Suitable electron beam chambers are commercially available from Electron Vision Corporation under the trade name "ElectronCure™". The principles of operation and performance characteristics of such device are described in U.S. Pat. No. 5,003,178, the disclosure of which is incorporated herein by reference. The energy of the electrons is adjusted for the resist thickness, and the total dose applied will depend on the resist considered. The specific conditions will depend on the resist type and exposure system. In a preferred embodiment, the electron beam energy is preferably from about 0.5 to about 30 KeV, and more preferably from about 1 to about 12 KeV and most preferably from about 2 to about 8 KeV. The dose of electrons is from about 1 to about 500,000 $\mu C/cm^2$, preferably from about 50 to about 50,000 $\mu C/cm^2$ and more preferably from about 50 to about 5,000 $\mu C/cm^2$. The gas ambient in the electron beam tool can be any of the following gases: nitrogen, oxygen, hydrogen, argon, xenon, helium, ammonia, silane, a blend of hydrogen and nitrogen, ammonia or any combination of these gases. The electron beam current is preferably from about 1 to about 150 mA, and more preferably from about 1 to about 50 mA. The electron beam irradiating is conducted while the substrate is under a vacuum, for example while vacuum conditions are maintained in the range of from about $10^{-5}$ to about $10^2$ torr. Preferably, the electron beam exposing step is conducted with a wide, large beam of electron beam radiation from a uniform large area electron beam source which simultaneously covers the entire substrate area, i.e. an area of from about 4 inches to about 256 square inches. The end result of the electron beam treatment will be a photoresist film which is less soluble after exposure than prior to exposure. The resist compositions of the present invention are preferably resistant to acid-base etching solutions and provide effective protection for the unexposed resist-coated areas of the substrate.

After electron beam exposure, the photoresist film may optionally be heat treated again, such as by baking, as described above. This step serves to thereby further shrink the photoresist film, and to thereby cause chemical changes in the photoresist film. This step is optional, and is resist dependent.

The photoresist film is then developed, using conventional techniques, with a suitable developer such as an aqueous alkaline solution, whereby the nonimage areas of the photoresist film are removed and the image areas of the photoresist film remain on the substrate, for a positive acting resist. This forms the intended image in the resist film on the substrate. The development step may be conducted by immersion in a suitable developing solution. The solution is preferably agitated, for example, by nitrogen burst agitation. The substrates are allowed to remain in the developer until all, or substantially all, of the resist coating has dissolved from the irradiated areas. Typical examples of the aqueous alkaline solutions suitable as the developer include sodium hydroxide, tetramethylammonium hydroxide, or aqueous solutions of hydroxides of metals belonging to the Groups I and II of the periodic table such as potassium hydroxide. Aqueous solution of organic bases free from metal ions such as tetraalkylammonium hydroxide, for example, tetramethylammonium hydroxide (TMAH), tetraethylammonium hydroxide (TEAH) and tetrabutylammonium hydroxide (TBAH). More preferably, tetramethylammonium hydroxide (TMAH) are preferred. Furthermore, if desired, the aqueous basic solution used as the developer may additionally contain any additives such as a surface active agent in order to improve the resulting development effect.

Optionally, the substrate and the image areas of the photoresist film may again be overall flood exposed to electron beam radiation causing a chemical change in the image areas of the photoresist film. Such electron beam flood exposure may be done using the same conditions as described above, and certain parameters will depend on the resist considered and the subsequent process steps.

The result of this process of the present invention, outlined in FIG. 11, is the formation of shrinkage-controlled photoresist images which demonstrate less end rounding and less shortening on photoresist lines, as is shown in FIG. 12.

The following non-limiting examples serve to illustrate the invention. It will be appreciated that variations in proportions and alternatives in elements of the components of the invention will be apparent to those skilled in the art and are within the scope of the present invention.

EXAMPLE 1

A set of ten 100 mm Silicon wafers were prepared by spin coating and baking a chemically amplified resist according to the manufacturer's recommended process. The resist for this example is PAR-101A4 from Sumitomo Chemical of Osaka, Japan. The resist was spin coated on a bench top spin-coat system from Laurell Technologies. The resist was post apply baked (PAB) at 130° C. for 60 seconds per the manufacturer's recommended processing conditions. This resulted in a resist film thickness of approximately 4000 Å. This set of ten wafers was then split into two groups of five wafers each.

The resist was then optically exposed using a Pen-Ray lamp with emission bands at 2540 Å and 1893 Å across one-half of the wafer. The exposure time was 10 seconds for all wafers. A separate set of tests determined that 10 seconds was sufficient to expose the resist and allow for complete development of the material. No mask was used to create patterns for the following tests. The resist was then post exposure baked (PEB) at 130° C. for 60 seconds per the manufacturer's recommended processing conditions.

The wafers were then subjected to a flood electron beam irradiation treatment in an ElectronCure™ EC30-200M tool from Electron Vision Corporation. The exposure conditions were 4 keV, 4 mA, and the dose was varied from 100 $\mu C/cm^2$ to 300 $\mu C/cm^2$ in 50 $\mu C/cm^2$ steps. The dose assignments were as follows:

| Group 1 | | Group 2 | |
| --- | --- | --- | --- |
| Wafer 1 (W1) | 100 $\mu C/cm^2$ | Wafer 6 (W6) | 100 $\mu C/cm^2$ |
| Wafer 2 (W2) | 150 $\mu C/cm^2$ | Wafer 7 (W7) | 150 $\mu C/cm^2$ |
| Wafer 3 (W3) | 200 $\mu C/cm^2$ | Wafer 8 (W8) | 200 $\mu C/cm^2$ |
| Wafer 4 (W4) | 250 $\mu C/cm^2$ | Wafer 9 (W9) | 250 $\mu C/cm^2$ |
| Wafer 5 (W5) | 300 $\mu C/cm^2$ | Wafer 10 (W10) | 300 $\mu C/cm^2$ |

The electron beam exposures were such that one-half of the wafer was exposed. This overlapped with the optical exposure of the previous step such that there were four distinct quadrants on each wafer. They were characterized as follows:

| | |
| --- | --- |
| Quadrant 1 (Q1) | Optically Exposed |
| Quadrant 2 (Q2) | Optically Exposed + Electron Beam Exposed |
| Quadrant 3 (Q3) | Electron Beam Exposed |
| Quadrant 4 (Q4) | Unexposed |

This set of splits provided information on the changes in resist properties for the different states of the resist that would be present in the process.

After the electron beam exposures, the wafers in Group 2 received an additional bake at 130° C. for 60 seconds. The wafers in Group 1 received no additional bake processing.

The resist thickness was then measured for each of the four quadrants on all of the wafers. The thickness was measured using a M-88 spectroscopic ellipsometer from J. A. Woollam Inc. The thickness was measured at one point in each quadrant.

Figure 1B:
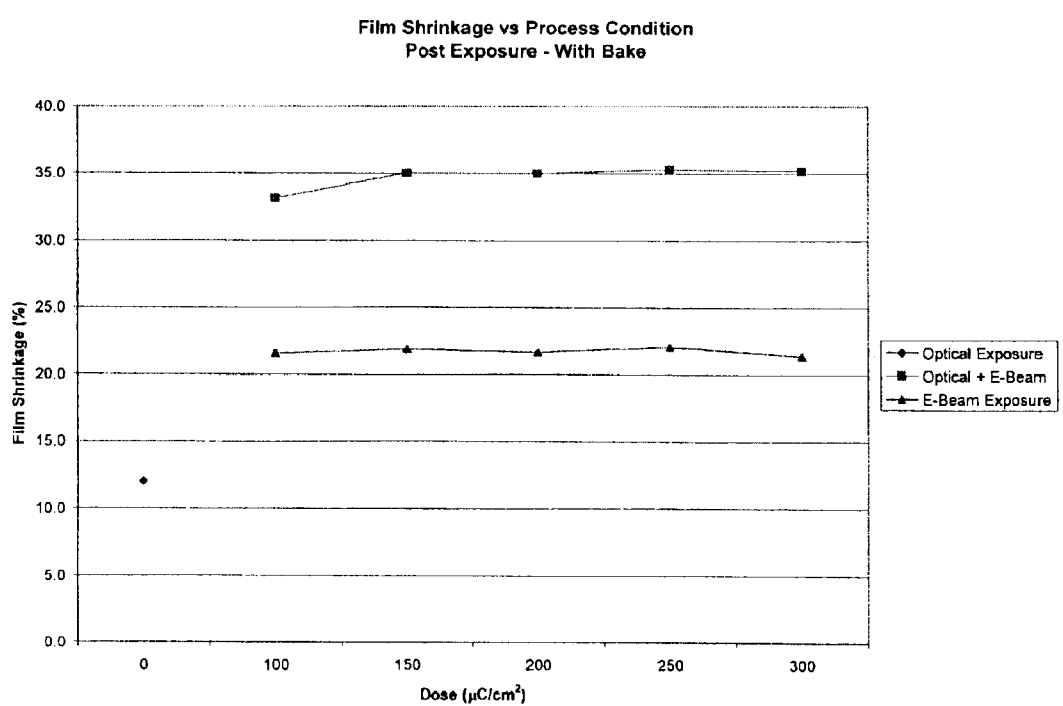

The resist film thickness after both optical exposure and electron beam exposure is shown in Table 1 and FIG. 1. For the wafers in Group 1 the optical exposure induces about a 10% film shrinkage due to the deprotection reaction that occurs upon exposure and post-exposure bake. In the areas that received the optical exposure and electron beam exposure the film shrinkage ranges from 18% to 26%. In the areas that received only the electron beam exposure the film shrinkage ranged from 6% to 12%. This would indicate that there are more changes occurring in the resist in the areas that were both optically and electron beam exposed, than for just the optical or just the electron beam exposures. For the wafers in Group 2, which received the additional bake step, the shrinkage in the optically exposed areas is slightly higher, at about 12%. The shrinkage for the areas that received the optical and electron beam exposure was about 35%, which is significantly higher than without the bake. The shrinkage is also independent of the dose applied. For the areas that received only the electron beam exposure the shrinkage was approximately 22%, and was also seen to be independent of dose. Thus, by applying the bake after the electron beam exposure, a significantly higher degree of film shrinkage is observed.

Figure 5:
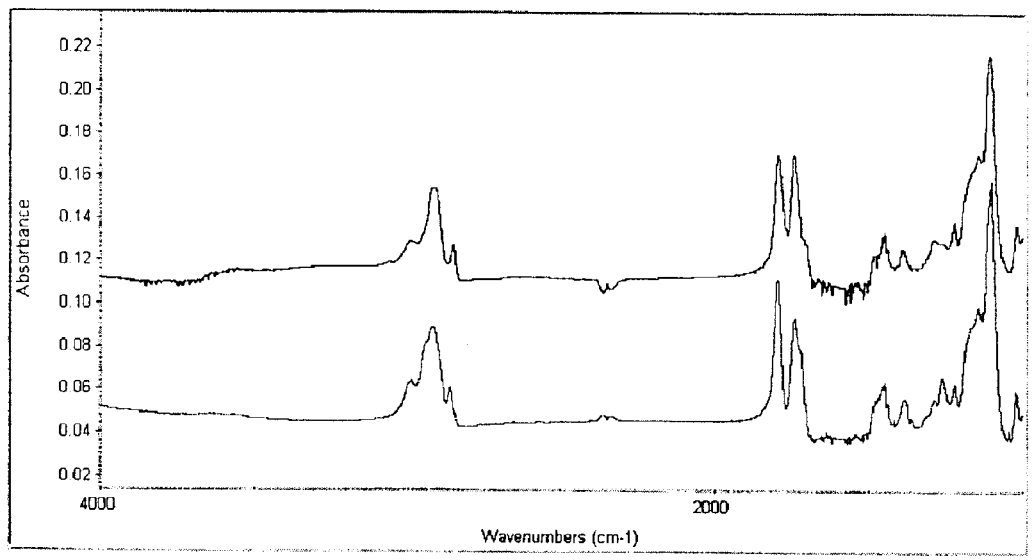
FIG. 5 shows a graph of spectra of the PAR-101A4 resist after coating with a post apply bake of 130° C. for 60 seconds and post exposure bake of 130° C. for 60 seconds, unexposed (bottom) and optically exposed (top).
Figure 6:
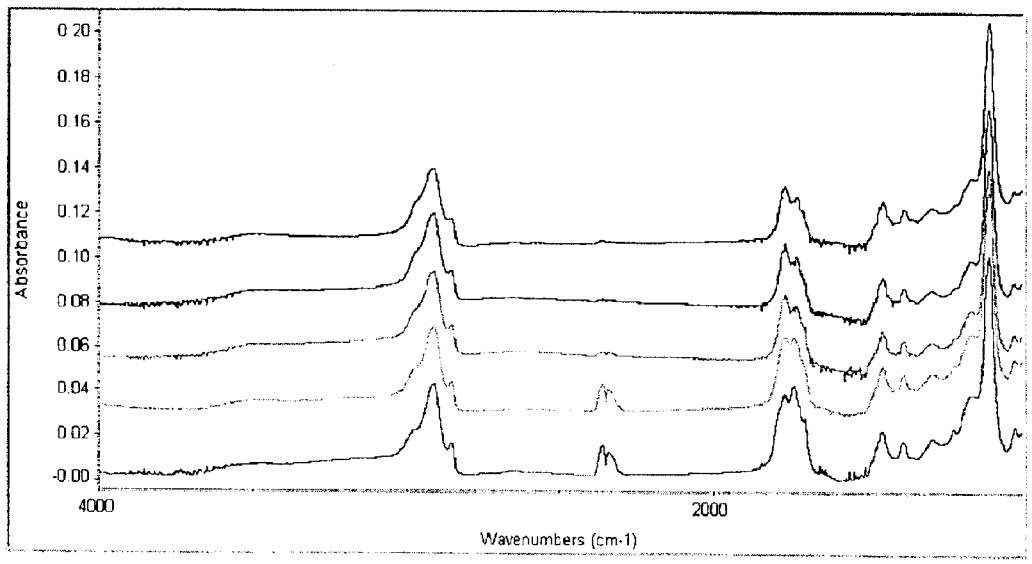
FIG. 6 shows a graph of spectra of the PAR-101A4 resist with a constant optical exposure and e-beam exposure dose levels of 100, 150, 200, 250, and 300 $\mu C/cm^2$.
Figure 7:
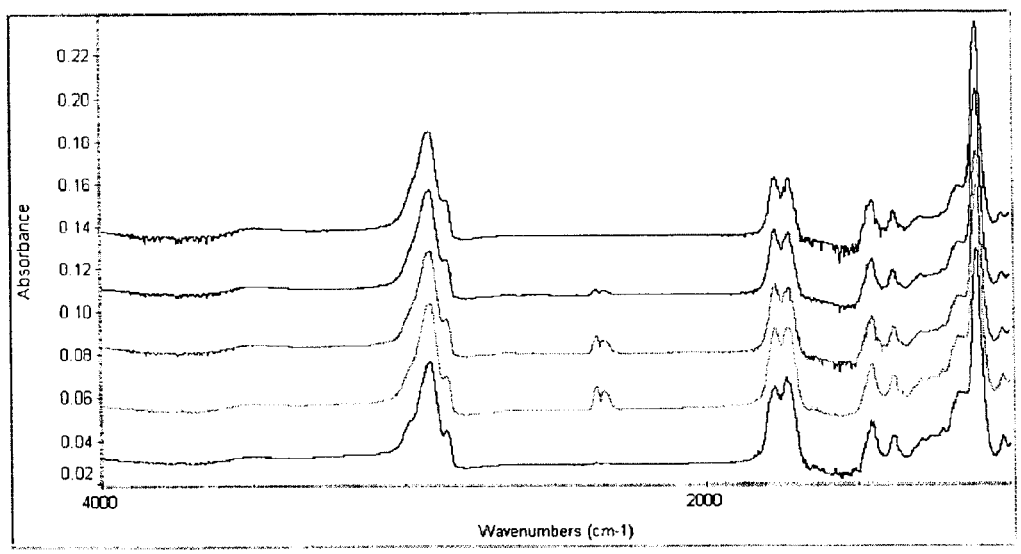
FIG. 7 shows a graph of spectra of the PAR-101A4 resist with e-beam exposure dose levels of 100, 150, 200, 250, and 300 $\mu C/cm^2$.

For the Group 1 wafers, without the bake after the electron beam exposure, the differences in the resulting chemical changes between the different exposure conditions are detailed in FIGS. 5, 6, and 7. These figures contain the FTIR spectra for the resist for different exposure conditions. For the optical exposure, the changes in the resist are shown in FIG. 5, as compared to the unexposed resist. Here there is a decrease in the height of the two carbonyl (C=O) peaks between 2000 and 1500 $cm^{-1}$ and a broadening of the peaks. The peaks look as though there is a much broader peak superimposed with the two carbonyl bands. For the optical exposure, there is not a substantial change in the chemistry of the resist due to the exposure and bake. For the region that received the optical and electron beam exposure, FIG. 6, there is a more significant change in the carbonyl peaks. The modification of the carbonyl peaks is much more pronounced as there has been a greater reduction in peak heights as well as a greater degree of broadening. For the lowest dose, 100 $mC/cm^2$, the two carbonyl peaks appear to be overlapped by one broader peak. As the electron beam dose is increased the combined peak decreases substantially. There is also a change in the peaks between 3200 and 2800 cm-1 which are for the C—$H_x$ (e.g. C—H, C—$H_2$, or C—$H_3$) groups. The modification of the C—$H_x$ peaks is seen to increase with increasing dose. The peak at approximately 3000 $cm^{-1}$ is eliminated with the lowest dose, and the peaks at approximately 2950 and 2900 and $cm^{-1}$ are reduced with increasing dose. For the resist that received only the electron beam exposure, FIG. 7, there are slightly different changes in the FTIR spectra. The carbonyl peaks remain distinct even at the highest dose and they are not reduced as much with increasing dose. Additionally the broadening of the two peaks, or the one overlapping peak, is not as pronounced. The more telling difference is for the C—H peaks, here there is not as significant a change in the peak heights as compared to the optical plus electron beam exposure areas. The peak at 3000 $cm^{-1}$ is eliminated, but the peaks at 2950 and 2900 $cm^{-1}$ are not reduced as substantially with increasing dose. Thus, it can be concluded that there is a difference in the exposure/reaction chemistry between optically exposed and unexposed areas when irradiated with the flood electron beam.

Figure 8:
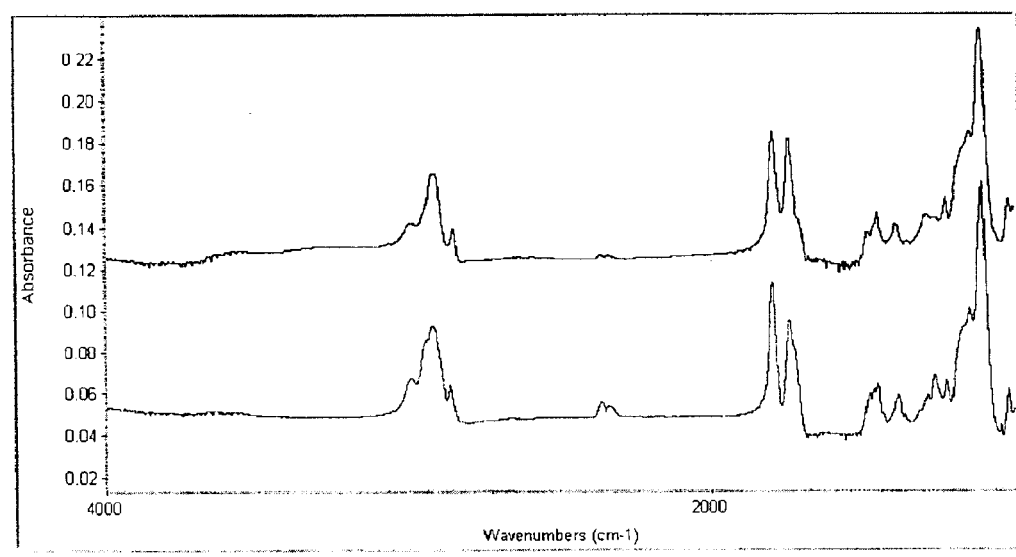
FIG. 8 shows a graph of spectra of the PAR-101A4 resist after a second post exposure bake at 130° C. for 60 seconds, unexposed (bottom) and optically exposed (top).
Figure 9:
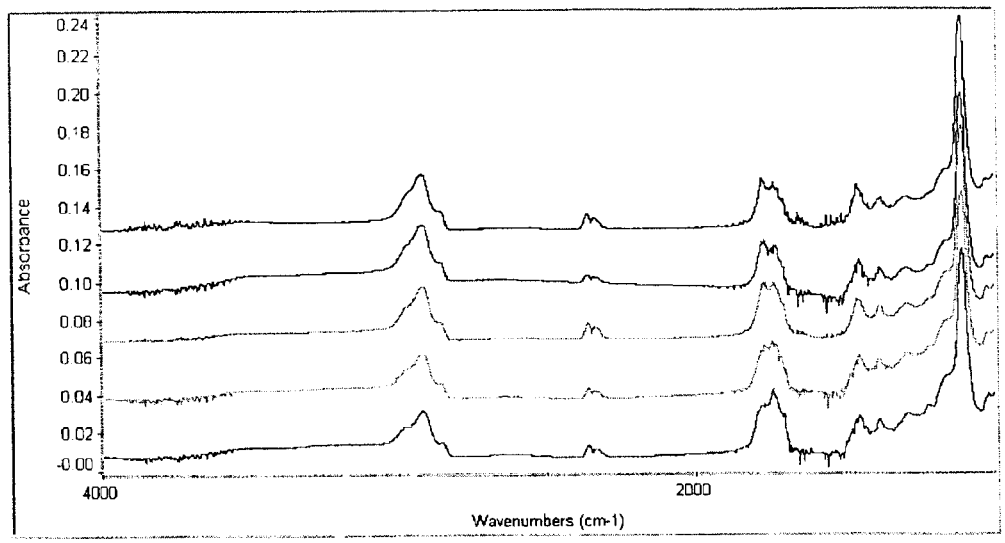
FIG. 9 shows a spectra of the PAR-101A4 resist with a constant optical exposure and e-beam exposure dose levels of 100, 150, 200, 250, and 300 $\mu C/cm^2$ and a second post exposure bake at 130° C. for 60 seconds.
Figure 10:
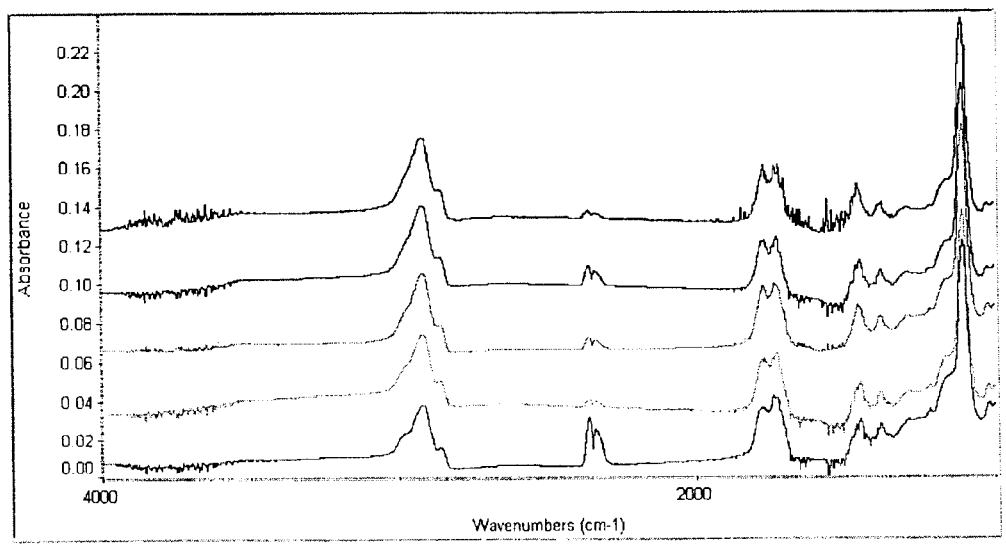
FIG. 10 shows a spectra of the PAR-101A4 resist with e-beam exposure dose levels of 100, 150, 200, 250, and 300 $\mu C/cm^2$ and a second post exposure bake at 130° C. for 60 seconds.

For the Group 2 wafers, with the bake after the electron beam exposure, the differences in the resulting chemical changes between the different exposure conditions are detailed in FIGS. 8, 9, and 10. For the optical exposure, the changes in the resist are shown in FIG. 8, as compared to the unexposed resist. Here again there is a decrease in the height of the two carbonyl (C=O) peaks between 2000 and 1500 $cm^{-1}$ and a broadening of the peaks. The broadening appears to be slightly more pronounced with the second bake. For the region that received the optical and electron beam exposure, FIG. 9, there is a more significant change in the carbonyl peaks. The modification of the carbonyl peaks is much more pronounced as there has been a greater reduction in peak heights as well as a greater degree of broadening with the additional bake. As the electron beam dose is increased the combined peak decreases substantially. There is also a more pronounced change in the peaks between 3200 and 2800 $cm^{-1}$ which are for the C—$H_x$ (e.g. C—H, C—$H_2$, or C—$H_3$) groups. Again, the modification of the C—$H_x$ peaks is seen to increase with increasing dose. The peak at approximately 3000 $cm^{-1}$ is eliminated with the lowest dose, and the peaks at approximately 2950 and 2900 and $cm^{-1}$ are reduced with increasing dose. For the resist that received only the electron beam exposure, FIG. 10, there are slightly different changes in the FTIR spectra. As with the previous group, the changes in the resist are more pronounced with the application of the second bake. The broadening is not as significant, and the peak heights are reduced more substantially. Again the modification of the C—H peaks is much different between the optical plus electron beam and the electron beam only areas. For the electron beam exposures there is not as significant a change in the peak heights as compared to the optical plus electron beam exposure areas. The peak at 3000 $cm^{-1}$ is eliminated, but the peaks at 2950 and 2900 $cm^{-1}$ are not reduced as substantially with increasing dose. Again, it can be concluded that there is a difference in the exposure/reaction chemistry between optically exposed and unexposed areas when irradiated with the flood electron beam. Additionally, the application of a second bake after the electron beam exposure drives additional reactions and changes in the resist.

After the optical and electron beam exposures, the resist films were developed for 60 seconds in PD 523AD, and TMAH based developer. The development was immersion in a bath of the developer followed by a rinse in D.I. water. Each wafer was developed individually.

The resist thickness values after development are listed in Table 2. For most of the optically exposed areas the resist was totally removed after the 60 second development. The same was true for some areas that received optical and electron beam exposures. The unexposed areas showed little or no resist loss due to the development which is to be expected.

Figure 2A:
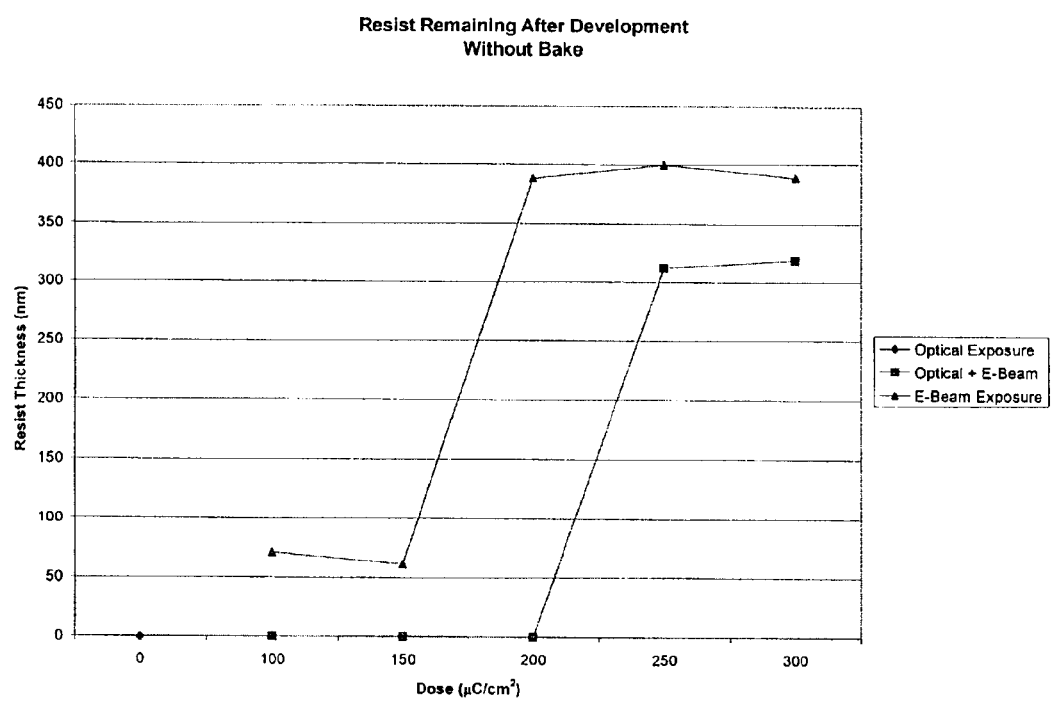
FIGS. 2A and 2B show graphs of resist thickness remaining after 60 second development for the optically exposed and optically plus e-beam exposed areas without and with baking.
Figure 2B:
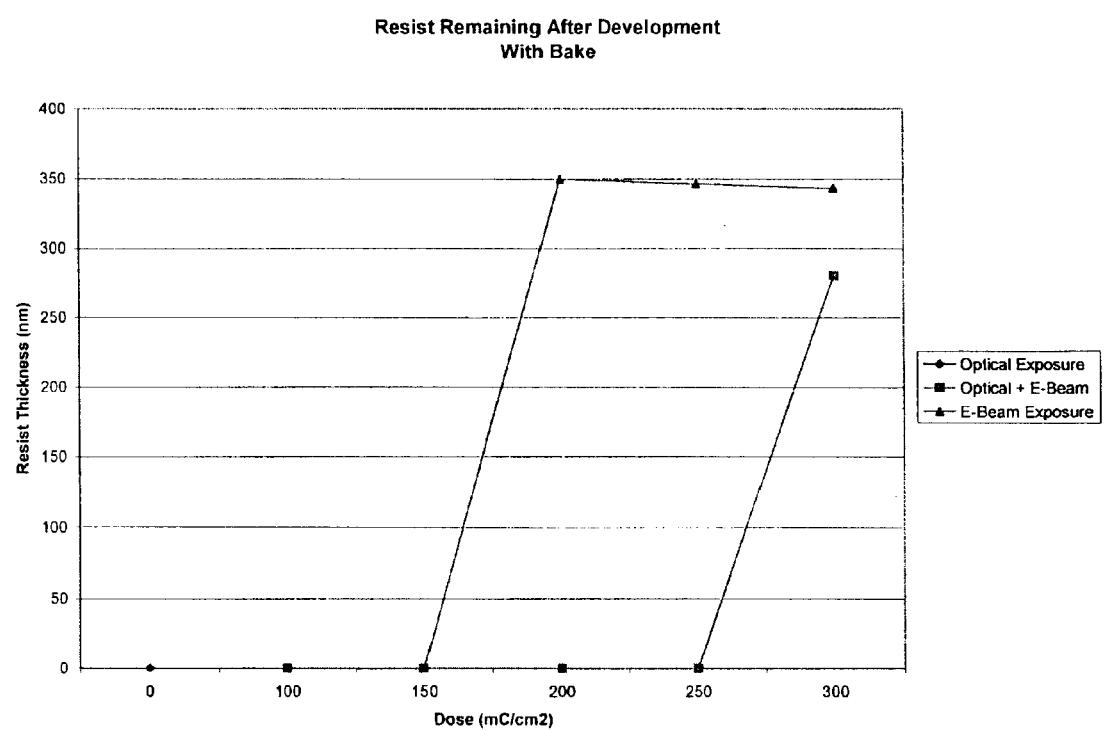

The resist remaining after development is shown graphically in FIG. 2 for Groups 1 and 2. For Group 1, without the bake after the electron beam exposure, the resist is mostly removed for the electron beam exposed areas at 100 and 150 $\mu C/cm^2$. At 200 $\mu C/cm^2$ and above the resist removed by the development drops substantially. For the areas with the optical and electron beam exposures the resist is totally removed for the 100, 150, and 200 $\mu C/cm^2$ dose levels. Above 250 $\mu C/cm^2$ the resist removal also drops substantially. This would indicate that at dose levels between 200 and 250 $\mu C/cm^2$ the resist can be exposed with the electron beam and developed with the optically exposed areas developing away and the optically unexposed areas remaining. For Group 2, which received the second bake after electron beam exposure, the development behavior is slightly different. In this case the development rate for the areas with the electron beam exposure drop substantially above 200 $\mu C/cm^2$. While the areas that received both the optical and electron beam exposures do not show a drop in development rate until 300 $\mu C/cm^2$ is reached. Thus, the application of the bake after the electron beam exposure effects the development properties for both optically exposed and unexposed resist.

Figure 3A:
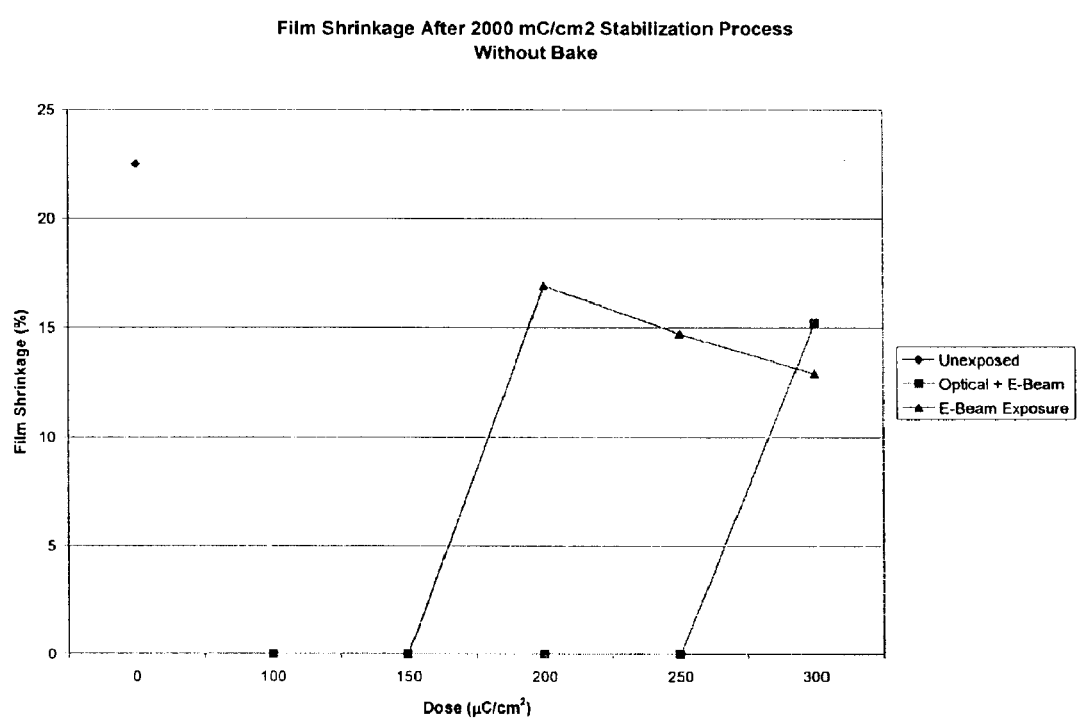
FIGS. 3A and 3B show graphs of resist film shrinkage after applying a stabilization step of 2000 $\mu C/cm^2$ for the optically exposed and optically plus e-beam exposed areas.
Figure 3B:
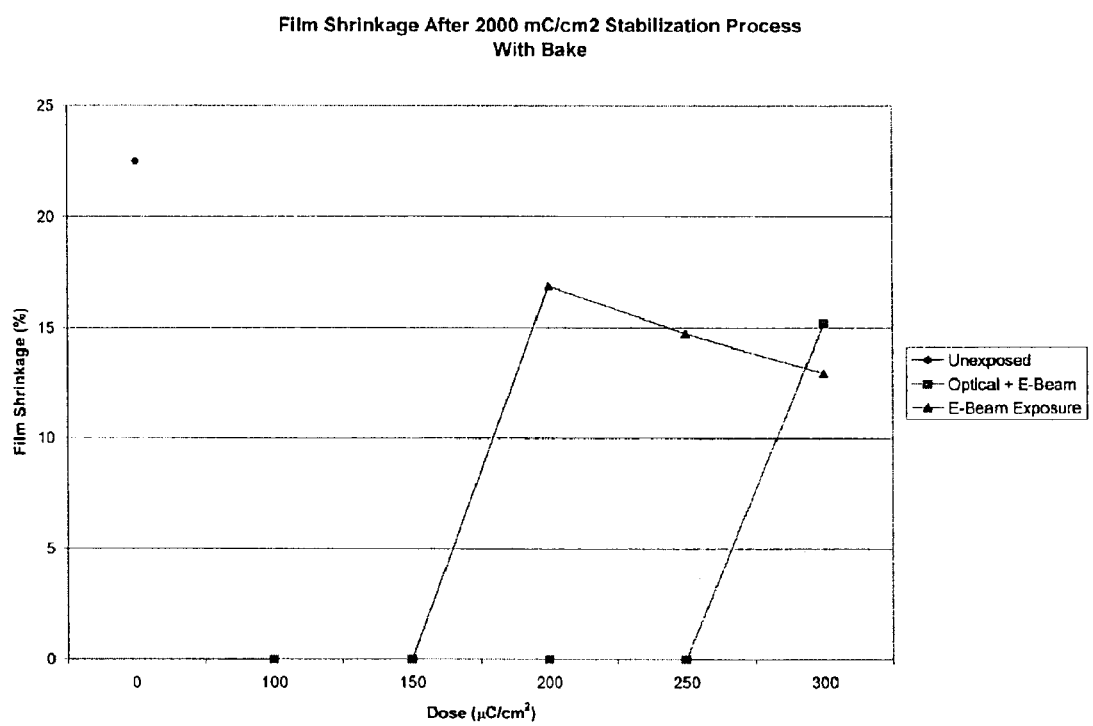
Figure 4:
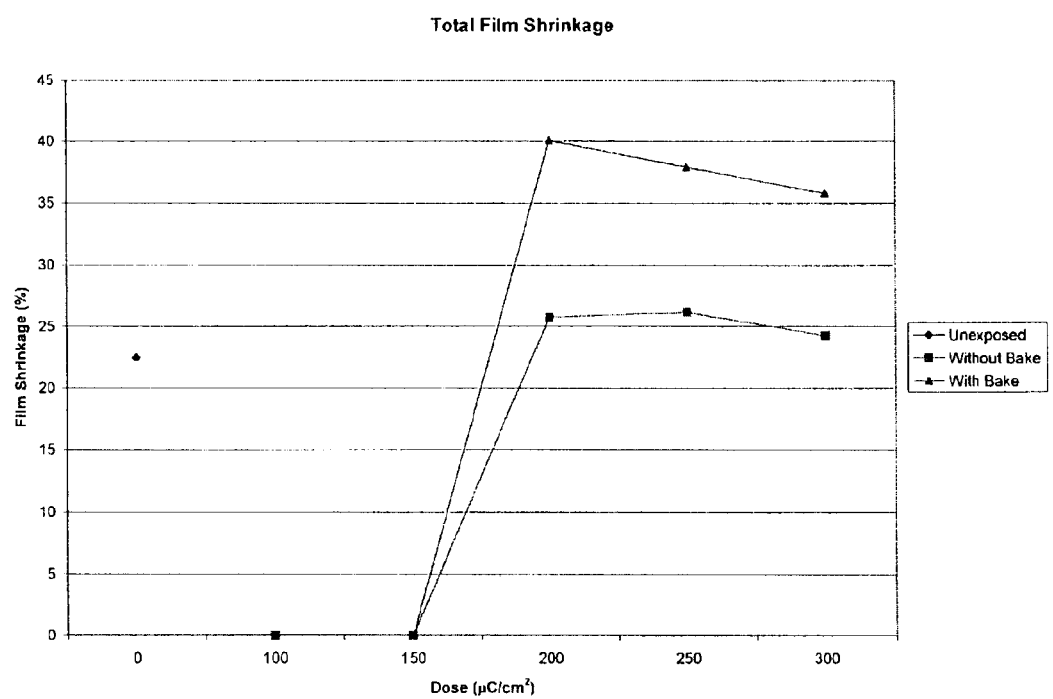
FIG. 4 shows a graph of total resist film shrinkage after processing and stabilization for the optically exposed and optically plus e-beam exposed areas.

After development, a stabilization process of 2000 $\mu C/cm^2$ was applied to the resist films. The resist thickness values after stabilization, and the resulting film shrinkage are detailed in Table 3. The resulting film shrinkage is shown graphically in FIG. 3. The shrinkage behavior is similar for both Group 1 and Group 2 with the film shrinkage ranging from approximately 18% to approximately 13%. The fact that the shrinkage decreases with increasing initial electron beam exposure would indicate that a significant portion of the modification of the resist occurs within the first 200 to 300 $\mu C/cm^2$ of electron beam exposure. The total film shrinkage of the resist is shown in FIG. 4 for both Group 1 and Group 2. This is the sum of the shrinkage from the initial electron beam exposure and the stabilization process. For Group 1 the total shrinkage is approximately 25% while the shrinkage for Group 2 is between 35% and 40%. This would indicate that the bake after the initial electron beam exposure has a significant effect on the resist material. The optically unexposed areas showed a film shrinkage of about 22%.

TABLE 1

Resist film thickness and calculated shrinkage after exposure and before development.

| | | After Exposure - Before Development | | | | | | |
|---|---|---|---|---|---|---|---|---|
| Wafer Identification | Process Conditions | Q1 Optical Exposure Only | Q2 Optical Plus E-beam | Q3 E-beam Only | Q4 Unexposed | Shrinkage Optical Exposure | Shrinkage Optical + E-beam | Shrinkage E-Beam Exposure |
| Wafer 1 | 100 | 398.59 | 363.85 | 418.07 | 442.76 | 10.0% | 17.8% | 5.6% |
| Wafer 2 | 150 | 399.68 | 352.66 | 413.71 | 444.6 | 10.1% | 20.7% | 6.9% |
| Wafer 3 | 200 | 403.3 | 346.66 | 405.98 | 445.61 | 9.5% | 22.2% | 8.9% |
| Wafer 4 | 250 | 409.48 | 350.17 | 407.19 | 459.78 | 10.9% | 23.8% | 11.4% |
| Wafer 5 | 300 | 400.29 | 334.05 | 397.8 | 448.91 | 10.8% | 25.6% | 11.4% |
| Wafer 6 | 100 | 393.27 | 297.16 | 348.53 | 444.36 | 11.5% | 33.1% | 21.6% |
| Wafer 7 | 150 | 393.58 | 287.23 | 345.06 | 441.58 | 10.9% | 35.0% | 21.9% |
| Wafer 8 | 200 | 394.34 | 292.74 | 352.49 | 450.07 | 12.4% | 35.0% | 21.7% |
| Wafer 9 | 250 | 394.11 | 291.51 | 351 | 450.78 | 12.6% | 35.3% | 22.1% |
| Wafer 10 | 300 | 391.83 | 288.14 | 349.6 | 444.64 | 11.9% | 35.2% | 21.4% |

TABLE 2

Resist film thickness and calculated resist loss after 60 second development in PD-523AD.

| | After Development | | | | Resist Loss Due to Development: 60 Seconds in PD-523AD | | |
|---|---|---|---|---|---|---|---|
| Wafer Identification | Q1 Exposure Only | Q2 Optical + E-beam | Q3 E-beam Only | Q4 Unexposed | Q1 Exposure Only | Q2 Optical + E-beam | Q3 E-beam Only |
| Wafer 1 | 0 | 0 | 70.99 | 440.75 | — | 363.85 | 347.08 |
| Wafer 2 | 0 | 0 | 61.31 | 443.21 | — | 352.66 | 352.4 |
| Wafer 3 | 0 | 0 | 388.46 | 447.5 | — | 346.66 | 17.52 |
| Wafer 4 | 0 | 312.32 | 399.64 | 456.36 | — | 37.85 | 7.55 |
| Wafer 5 | 0 | 318.76 | 389.12 | 455.88 | — | 15.29 | 8.68 |

TABLE 2-continued

Resist film thickness and calculated resist loss after 60 second development in PD-523AD.

| | After Development | | | | Resist Loss Due to Development: 60 Seconds in PD-523AD | | |
|---|---|---|---|---|---|---|---|
| Wafer Identification | Q1 Exposure Only | Q2 Optical + E-beam | Q3 E-beam Only | Q4 Unexposed | Q1 Exposure Only | Q2 Optical + E-beam | Q3 E-beam Only |
| Wafer 6 | 0 | 0 | 0 | — | — | 297.16 | 348.53 |
| Wafer 7 | 0 | 0 | 0 | 441.38 | — | 287.23 | 345.06 |
| Wafer 8 | 0 | 0 | 349.79 | 449.73 | — | 292.74 | 2.7 |
| Wafer 9 | 0 | 0 | 346.39 | 450.97 | — | 291.51 | 4.61 |
| Wafer 10 | 0 | 280.57 | 343.32 | 445.75 | — | 7.57 | 6.28 |

TABLE 3

Resist film shrinkage after applying a stabilization step of 2000 $\mu C/cm^2$

| | After Processing with 2000 $\mu C/cm^2$ at 4 keV, 4 mA | | | | | | | |
|---|---|---|---|---|---|---|---|---|
| Wafer Identification | Q1 Optical Exposure Only | Q2 Optical Plus E-beam | Q3 E-beam Only | Q4 Unexposed | Shrinkage Optical + E-beam | Shrinkage E-beam Only | Shrinkage Unexposed | Total Shrinkage E-Beam Only |
| Wafer 1 | — | — | — | — | | | | |
| Wafer 2 | — | — | — | — | | | | |
| Wafer 3 | — | — | 322.8 | 346.6 | | 16.90 | 22.55 | 25.8 |
| Wafer 4 | — | — | 340.7 | 355.1 | | 14.74 | 22.17 | 26.2 |
| Wafer 5 | — | 270.2 | 338.7 | 349.4 | 15.2 | 12.94 | 23.35 | 24.3 |
| Wafer 6 | — | — | — | — | | | | |
| Wafer 7 | — | — | — | — | | | | |
| Wafer 8 | — | — | 285.3 | 349.3 | | 18.42 | 22.31 | 40.1 |
| Wafer 9 | — | — | 291.6 | 351.4 | | 15.80 | 22.07 | 37.9 |
| Wafer 10 | — | 237.3 | 293.6 | 344. | 15.4 | 14.46 | 22.69 | 35.8 |

It has been found that by applying a flood electron beam exposure in combination with an optical or other patterning exposure that resist shrinkage due to subsequent stabilization or CD-SEM measurement (line slimming) can be reduced, improved etch resistance can be achieved, including improved etch selectivity and image stability, and improved image fidelity can be achieved, with improved side wall angle, reduced optical proximity effects and reduced corner rounding and line end shortening. This is unexpected as it has been found that the patterning exposure (optical exposure) induces a change in the patterned or exposed areas that results in very different behavior during the subsequent electron beam exposure when compared to the unexposed areas. This allows for the exposure of the resist before develop which addresses several issues with the patterning and stabilization of the resist material. Thus, the shrinkage that would be seen during the stabilization step is now constrained laterally by the resist. The resist is thus free to shrink vertically which provides the improved etch resistance but is constrained laterally such that the resist does not pullback or round off. Further, by tailoring the electron beam exposure prior to development, the solubility as a function of depth into the resist can be altered such that the side wall angle and certain aspects of the latent image can be controlled thus providing an improved resist image after develop. The net result of the combined patterning and flood electron beam exposure is an improved resist image which exhibits enhanced etch selectivity and image stability. After development, a further electron beam stabilization step may be required. Some additional resist shrinkage may occur at this time. However, the amount of lateral resist shrinkage is reduced significantly compared to a process of using just a flood e-beam stabilization step after the patterning and develop step.

While the present invention has been particularly shown and described with reference to preferred embodiments, it will be readily appreciated by those of ordinary skill in the art that various changes and modifications may be made without departing from the spirit and scope of the invention. It is intended that the claims be interpreted to cover the disclosed embodiment, those alternatives which have been discussed above and all equivalents thereto.

What is claimed is:

1. A method for forming a shrinkage-controlled photoresist images, comprising the steps of sequentially:
   a) applying and drying a photoresist onto a surface of a substrate to thereby form a photoresist film on the substrate; thereafter
   b) imagewise exposing the photoresist film to actinic radiation to thereby form image and nonimage areas of the photoresist film; thereafter
   c) optionally heating the entire photoresist turn to degrade the non-image areas of the photoresist film;
   d) overall flood exposing the entire photoresist film to electron beam radiation to thereby cause a chemical change in the image and nonimage areas of the photoresist film; thereafter
   e) optionally heating the photoresist film again to thereby cause a further chemical change in the photoresist film; thereafter
   f) developing the photoresist film with a developer, such that the nonimage areas of the photoresist film are removed, and the image areas of the photoresist film remain on the substrate; and g) optionally thereafter again overall flood exposing the image areas of the phororesist film and the substrate to electron beam radiation to thereby further cause a chemical change in the image areas of the photoresist film.

2. The method of claim 1 wherein step (c) is conducted.

3. The method of claim 1 wherein step (c) is not conducted.

4. The method of claim 1 wherein step (g) is conducted.

5. The method of claim 1 wherein step (g) is not conducted.

6. The method of claim 1 wherein the photoresist is positive working.

7. The method of claim 1 wherein the photoresist is negative working.

8. The method of claim 1 wherein the photoresist comprises a combination or a naphthoquinone diazide and an aqueous alkaline solution or swellable polymer.

9. The method of claim 1 wherein the photoresist comprises a photosensitive composition which comprises:

(i) at least one water insoluble, acid decomposable polymer which is substantially transparent to ultraviolet or x-ray radiation, wherein said polymer is present in the photosensitive composition in an amount sufficient to form a uniform film of the composition components when it is coated on a substrate and dried;

(ii) at least one photosensitive compound capable of generating an acid upon exposure to sufficient activating ultraviolet, electron beam or x-ray radiation energy, said photosensitive compound being present in an amount sufficient to substantially uniformly photosensitize the photosensitive composition.

10. The method of claim 9 wherein step (b) comprises imagewise exposing the photosensitive composition to sufficient activating ultraviolet, electron beam or x-ray radiation energy to cause the photosensitive compound to generate sufficient acid to decompose the polymer in the imagewise exposed areas of the photosensitive composition.

11. The method of claim 9 wherein the at least one water insoluble, acid decomposable polymer is substantially transparent to ultraviolet radiation at a wavelength of about 157 nm; wherein the at least one photosensitive compound is capable of generating an acid upon exposure to sufficient activating energy at a wavelength of about 157 nm; and wherein the imagewise exposing of the photosensitive composition to sufficient activating energy is conducted at a wavelength of about 157 nm.

12. The method of claim 9 wherein the at least one water insoluble, acid decomposable polymer is substantially transparent to ultraviolet radiation at a wavelength of about 193 nm; wherein the at least one photosensitive compound is capable of generating an acid upon exposure to sufficient activating energy at a wavelength of about 193 nm; and wherein the imagewise exposing of the photosensitive composition to sufficient activating energy is conducted at a wavelength of about 193 nm.

13. The method of claim 9 wherein the at least one water insoluble, acid decomposable polymer is substantially transparent to ultraviolet radiation at a wavelength of about 248 nm; wherein the at least one photosensitive compound is capable of generating an acid upon exposure to sufficient activating energy at a wavelength of about 248 nm; and wherein the imagewise exposing of the photosensitive composition to sufficient activating energy is conducted at a wavelength of about 248 nm.

14. The method of claim 9 wherein the at least one water insoluble, acid decomposable polymer is substantially transparent to x-ray wavelength radiation; wherein the at least one photosensitive compound is capable of generating an acid upon exposure to sufficient activating energy at x-ray wavelengths; and wherein the imagewise exposing of the photosensitive composition to sufficient activating energy is conducted at an x-ray wavelength.

15. The method of claim 9 wherein the at least one water insoluble, acid decomposable polymer is substantially transparent to ultraviolet radiation at a wavelength of about 365 nm; wherein the at least one photosensitive compound is capable of generating an acid upon exposure to sufficient activating energy at a wavelength of about 365 nm; and wherein the imagewise exposing of the photosensitive composition to sufficient activating energy is conducted at a wavelength of about 365 nm.

16. The method of claim 9 wherein the at least one photosensitive compound is capable of generating an acid upon exposure to sufficient activating electron beam radiation; and wherein the imagewise exposing of the photosensitive composition to sufficient activating energy is conducted by electron beam radiation.

* * * * *